US008711331B2

(12) United States Patent
Kugler et al.

(10) Patent No.: US 8,711,331 B2
(45) Date of Patent: Apr. 29, 2014

(54) OPTICAL MODULE FOR A MICROLITHOGRAPHY OBJECTIVE INCLUDING HOLDING AND SUPPORTING DEVICES

(75) Inventors: Jens Kugler, Heubach (DE); Franz Sorg, Oberkochen (DE); Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 855 days.

(21) Appl. No.: 11/597,297

(22) PCT Filed: May 24, 2005

(86) PCT No.: PCT/EP2005/005600
§ 371 (c)(1),
(2), (4) Date: Jan. 18, 2008

(87) PCT Pub. No.: WO2005/116773
PCT Pub. Date: Dec. 8, 2005

(65) Prior Publication Data
US 2008/0198352 A1    Aug. 21, 2008

(30) Foreign Application Priority Data

May 24, 2004  (DE) .......................... 10 2004 025 832

(51) Int. Cl.
*G03B 27/70* (2006.01)
(52) U.S. Cl.
USPC .......................................................... 355/66
(58) Field of Classification Search
USPC ................... 355/66, 67, 53; 359/850
See application file for complete search history.

(56) References Cited

U.S. PATENT DOCUMENTS

| 6,406,820 B1* | 6/2002 | Ota ................................. 430/30 |
| 2002/0044260 A1* | 4/2002 | Takahashi et al. .............. 353/31 |
| 2002/0163741 A1 | 11/2002 | Shibazaki | |

FOREIGN PATENT DOCUMENTS

| EP | 1 168 028 | 1/2002 |
| EP | 1 312 965 | 5/2003 |
| JP | 2002/131605 | 5/2002 |

OTHER PUBLICATIONS

International Preliminary Report on Patentability based on PCT/EP2005/005600 dated Nov. 29, 2006.

* cited by examiner

*Primary Examiner* — Toan Ton
*Assistant Examiner* — Chia-how Michael Liu
(74) *Attorney, Agent, or Firm* — Fish & Richardson P.C.

(57) ABSTRACT

There is provided an optical module for an objective. The optical module includes (a) a first holding device with an inner circumference, which extends in a first circumferential direction, (b) at least one first supporting device for supporting a first optical element and being fixed at said inner circumference of said first holding device, (c) an annular circumferential first assembly space being defined by displacing said first supporting device once in a revolving manner along said first circumferential direction, (d) at least one second supporting device being provided for supporting a second optical element and being fixed at said inner circumference of said first holding device, and (e) an annular circumferential second assembly space being defined by displacing said second supporting device once in a revolving manner along said first circumferential direction. The first assembly space intersects the second assembly space.

27 Claims, 7 Drawing Sheets

OPTICAL MODULE FOR A MICROLITHOGRAPHY OBJECTIVE INCLUDING HOLDING AND SUPPORTING DEVICES

BACKGROUND OF THE INVENTION

The present invention relates to an optical module for an objective. The invention can be used in connection with microlithography employed in the production of microelectronic circuits. It further concerns, therefore, an objective barrel which is suitable in particular for application in a microlithographic apparatus, as well as such a microlithographic apparatus including such an objective barrel.

In the field of microlithography in particular, it is necessary for the employed optical elements of the objective barrel, i.e. the lenses for example, to be positioned spatially with respect to one another with as high a degree of precision as possible, in order to achieve a suitably high image quality. The high precision requirements are not least a consequence of the constant demand to increase the resolution of optical systems used in the production of microelectronic circuits, in order to advance the miniaturisation of the microelectronic circuits to be produced.

With the increased resolution, the demands increase on the positioning precision of the employed optical elements. The latter must be maintained as far as possible in the installed state over the whole service life in order to avoid image errors. Furthermore, there is in this regard the requirement to achieve a dynamic behaviour of the employed optical system that is as favourable as possible, with resonant frequencies that are as high as possible.

For a large number of optical applications, but especially in the field of the aforementioned microlithography, objective barrels consisting of a plurality of optical modules are employed. The individual optical modules include as a rule an optical element, such as a lens etc., which is supported by means of one or more supporting devices at the inner circumference of a holder. Depending on the conditions of the optical system, i.e. amongst other things the optical properties of the objective that are to be achieved, it is often necessary to position several optical elements closely adjacent one another.

In the case of objectives with one lens per optical module, such as are known for example from EP 1 168 028 A1, a close arrangement of the lenses is achieved in which the supporting devices with the lenses located therein are arranged in a nested manner. This leads on the one hand to comparatively elongated lens barrels. This is due to the fact that the holder of each optical module must have a certain extension in the direction of the optical axis of the objective barrel in order to have sufficient strength and rigidity. Furthermore, the spacing requirement for the lenses together with the axial extension of the holder may give rise to very long supporting devices. These are disadvantageous particularly from the rigidity standpoint, since this is accompanied by an undesirably low rigidity and consequently undesirably low resonant frequencies.

There is proposed in document US 2002/0163741 A1 an arrangement of optical modules stacked one upon the other, wherein there is provided in the given holder a recess for the accommodation of a part of the supporting devices of the optical module lying thereunder. A reduction in the length of the supporting devices can certainly be achieved by this means. The recesses, however, in turn cause a weakening and reduction in rigidity of the given holder, and this has to be compensated for, possibly at high cost. On the other hand, this solution is suitable only for certain designs of the supporting devices.

The object of the present invention, therefore, is to make available an optical module of the type mentioned at the outset, which does not have the aforementioned drawbacks or at least only to a lesser extent and guarantees, in particular, a space-saving, rigid arrangement.

BRIEF SUMMARY OF THE INVENTION

The present invention solves this problem with an optical module for an objective that includes a first holding device with an inner circumference, which extends in a first circumferential direction. The optical module also includes at least one first supporting device for supporting a first optical element and being fixed at the inner circumference of the first holding device. The optical module further includes an annular circumferential first assembly space being defined by displacing the first supporting device once in a revolving manner along the first circumferential direction. In addition, the optical module includes at least one second supporting device being provided for supporting a second optical element and being fixed at the inner circumference of the first holding device. Further, the optical module includes an annular circumferential second assembly space being defined by displacing the second supporting device once in a revolving manner along the first circumferential direction; and the first assembly space intersecting the second assembly space. For at least one optical element, a mounting device may be provided which is connected detachably to the end of said at least one supporting device for this optical element facing away from said first holding device.

Underlying the present invention is the cognition that, especially in the case of an arrangement of a plurality of optical elements lying close beside one another, a space-saving, rigid arrangement can be achieved if, at the first holding device, at least two optical elements are supported by, in each case, at least one respective first or second supporting device. The supporting devices each define respectively a first and second annular circumferential assembly space in the circumferential direction of the holding device. They are arranged in such a way that the first assembly space intersects the second assembly space.

As a result of this arrangement of supporting devices interlaced into one another or interlocked with one another, respectively, it is possible for the dimension of the common holding device for both to be kept short in the direction of their central axis. This dimension may possibly even be smaller than in the case of the support of a single optical element by a comparable holding device, since the mounting of further supporting devices may even contribute towards increasing the rigidity of the optical module.

As a result of this compact arrangement, furthermore, the supporting devices can also be kept as short as possible. This has an advantageous effect on the mass and the rigidity of the supporting devices and thus on the resonant frequencies of the arrangement.

In other words, compared with the known optical modules, it is possible, with identical rigidity of the arrangement, to achieve a significant reduction in the required assembly space and thus in the mass of the optical module, as a result of which an advantageous increase in the resonant frequency is obtained.

An object of the present invention, therefore, is an optical module for a lens, in particular for a microlithographic apparatus, which includes a first holding device with an inner circumference which extends in a first circumferential direction, and at least one first supporting device for supporting a first optical element and being connected to the inner circumference of the first holding device. An annular circumferential first assembly space is defined by displacing the first supporting device once in a revolving manner along the first circumferential direction. Furthermore, at least one second supporting device is provided for supporting a second optical element and being fixed at the inner circumference of the first holding device. An annular circumferential second assembly space is defined by displacing the second supporting device once in a revolving manner along the first circumferential direction. The first assembly space intersects the second assembly space.

A further object of the present invention is an objective barrel, in particular for a microlithographic apparatus, with an optical module according to the invention.

Finally, a further subject-matter of the present invention is a microlithographic apparatus for the transfer of a pattern formed on a mask onto a substrate using an optical projection system which includes an objective barrel according to the invention.

Further preferred embodiments of the invention will become apparent from the dependent claims and the following description of a preferred example of embodiment, which makes reference to the appended drawings.

DETAILED DESCRIPTION OF THE INVENTION

First Embodiment

Figure 1:
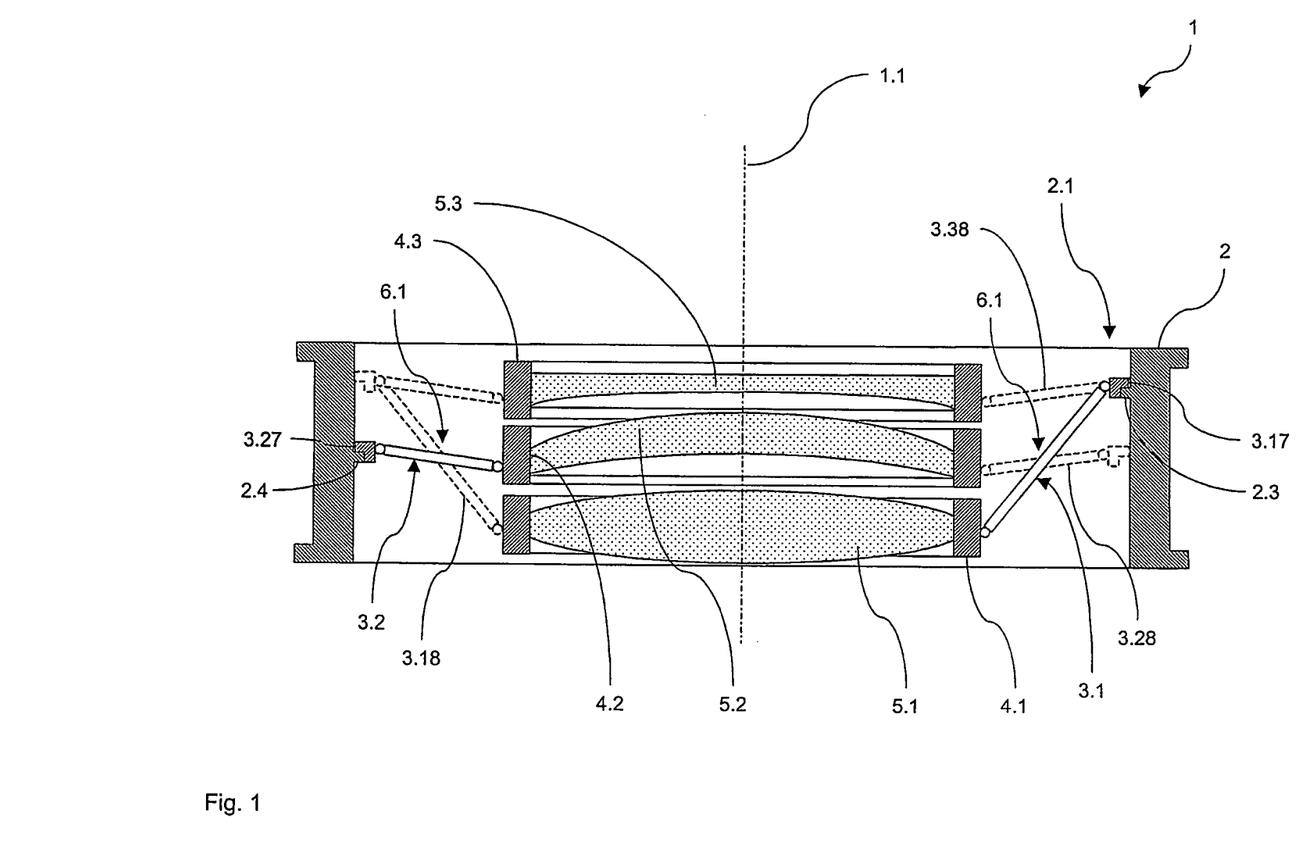
FIG. 1 is a schematic sectional representation of a preferred embodiment of the optical module according to the invention
Figure 2:
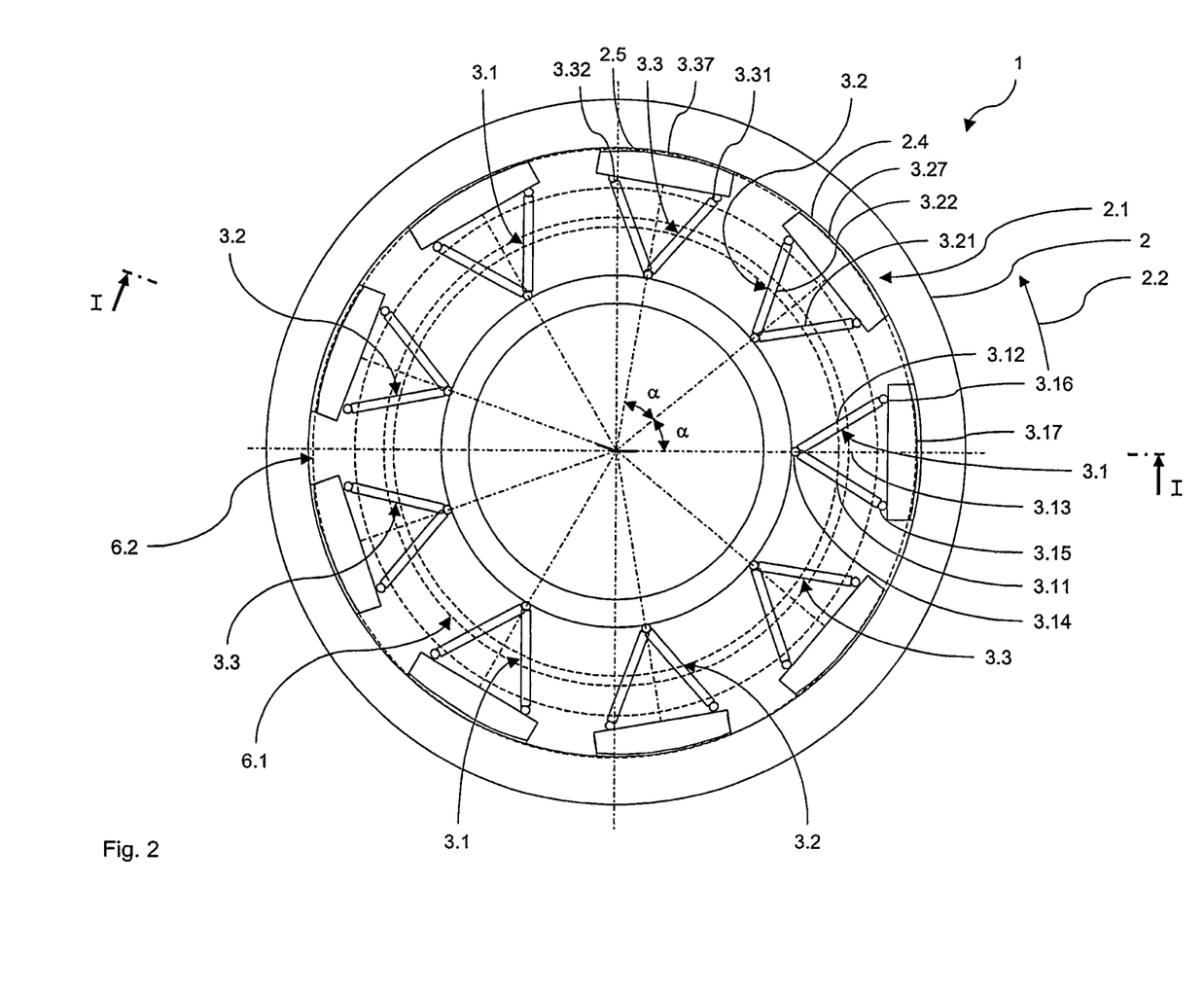
FIG. 2 is a schematic plan view of the optical module from FIG. 1.

A first preferred embodiment of the optical module 1 according to the invention for an objective for microlithography is first described with reference to FIGS. 1 and 2. FIG. 1 shows a diagrammatic sectional representation of the optical module 1, whilst FIG. 2 shows a schematic plan view of optical module 1 in the direction of module axis 1.1 of optical module 1. FIG. 1 is a cross-section along section line I-I from FIG. 2.

Optical module 1 includes a first holding device in the form of an annular holder 2, which is often referred to as a flange. This holder 2 has an inner circumference 2.1, which extends in a first circumferential direction 2.2. Three first supporting devices in the form of first bipods 3.1 (shown in very simplified form) are fixed with one end at the inner circumference 2.1 of the holder 2. First bipods 3.1 are connected with their other end to a first mounting device in the form of a first mounting 4.1. This first mounting 4.1 in turn carries a first optical element in the form of a lens 5.1. Accordingly, the first bipods 3.1 thus support the first lens 5.1 via the first mounting 4.1 on the first holder 2. In other words, the first lens 5.1 is thus fixed via the first mounting 4.1 and the first bipods 3.1 on the first holder 2.

The first bipods 3.1 each have a first leg 3.11 and a second leg 3.12. The latter are arranged inclined towards one another in their common plane, so that the respective bipod 3.1 has a central axis 3.13. the first bipods 3.1, furthermore, are distributed uniformly at the first circumference 2.1 of the holder 2, so that an angle of 120° is enclosed in each case between their first central axes 3.13 in the first plane, which lies parallel to the drawing plane of FIG. 2 and in which the circumferential direction 2.2 lies.

The first bipods 3.1 together form so-called parallel kinematics in the manner of a hexapod, by means of which the first mounting 4.1 and thus the first lens 5.1 are positioned spatially with respect to the holder 2. The first leg 3.11 and the second leg 3.12 are each fixed to holder 2 via a flexure 3.14, 3.15 and 3.16 mobile in the manner of a ball-and-socket joint. Each first bipod 3.1 therefore constrains two spatial degrees of freedom, so that a statically determined bearing of the first lens 5.1 on the holder 2 is brought about in the form of an isostatic bearing.

Whereas the flexure 3.14 on the mounting side is fixed directly to the first mounting 4.1, the two flexures 3.15 and 3.16 on the holder side are fixed to a first connection element 3.17. The first connection element 3.17 is in turn fixed detachably on a first contact element in the form of a first shoulder 2.3 at the inner circumference 2.1 of the holder 2. The first shoulders 2.3 are all located in a first connecting plane which runs perpendicular to the module axis 1.1. An arbitrary connection, for example a clamping joint or a screw joint, can be provided for the connection of the first connection element 3.17 to the holder 2 and the bipods 3.1 to the mounting.

The first shoulder 2.3 extends in the circumferential direction over roughly the same angular range as the first connection element 3.17. Thanks to the detachable connection between the respective connection element 3.17 and the respective first shoulder 2.3, it is possible to rotate the lens 5.1 about the module axis 1.1 and thus to compensate for image errors. It is also possible by this means to dismantle the lens 5.1 from the holder 2 and, if need be, to subject it to reworking, for example by means of an ion beam. As a result, an adjustment facility about the module axis 1.1 may then become unnecessary, as the case may be.

In order to be able to position the first lens 5.1 with respect to the holder 2, the first leg 3.11 and the second leg 3.12 are length-adjustable. In addition, or as an alternative, the position or spacing of at least one mobile part of the respective first leg 3.11 or 3.12 can be adjusted with respect to the holder 2. Finally, the axial distance between the first connection element 3.17 and the first shoulder 2.3 can be adjusted in the direction of the module axis 1.1. In any case, these adjustments can take place both by means of passive elements (e.g. setscrews etc.) and by means of controllable active elements (e.g. piezoelements etc.). It goes without saying, however, that with other variants of the invention the supporting devices can, if need be, also be designed non-adjustable at least in part.

The first lens 5.1 is fixed in the first mounting 4.1 in any suitable way in a positive connection and/or a frictional connection and/or and adhesive connection. Thus, for example, it can be glued, clamped etc. The first mounting 4.1 forms a precisely defined interface between the first lens 5.1 and the first bipods 3.1. It goes without saying, however, that with other variants of the invention provision can also be made such that the first bipods are fixed without the interposition of a mounting or the like on the lens.

As can also be seen from FIGS. 1 and 2, the optical module 1 also includes three second supporting devices in the form of second bipods 3.2 (also shown in very simplified form). The latter, like the first bipods 3.1, are each fixed with one end to the inner circumference 2.1 of the holder 2 by means of a second connection element 3.27. The second connection element 3.27 is again fixed detachably on a second shoulder 2.4 at the inner circumference 2.1 of the holder 2. The second shoulders 2.4 are all located in a second connecting plane which also runs normal to the module axis 1.1. The second connecting plane lies at a first distance below the first connecting plane.

With their other end, the second bipods 3.2 are connected to a second mounting device in the form of a second mounting 4.2. This second mounting 4.2 in turn carries a second optical element in the form of a second lens 5.2. Accordingly, the second bipods 3.2 thus support the second lens 5.2 via the second mounting 4.2 on the first holder 2. In other words, the second lens 5.2 is thus fixed via the second mounting 4.2 and the second bipods 3.2 to the first holder 2.

The second bipods 3.2 are designed like the first bipods 3.1 and are fixed to the holder 2 and the second mounting 4.2 respectively, so that in this regard reference is made to the explanations given above. In particular, the second bipods 3.2 also form so-called parallel kinematics in the manner of a hexapod, by means of which the second mounting 4.2 and thus the second lens 5.2 can be actively positioned spatially with respect to the holder 2. Finally, the optical module 1 also includes three third supporting devices in the form of third bipods 3.3 (also shown in very simplified form). The latter, like the first bipods 3.1, are fixed with one end to the inner circumference 2.1 of the holder 2 by means of a third connection element 3.37. The respective further connection element 3.37 is fixed detachably on a third shoulder 2.5 at the inner circumference 2.1 of the holder 2. The third shoulders 2.5, like the first shoulders 2.3, are all located in the first connecting plane which runs normal to the module axis 1.1.

With their other end, the third bipods 3.3 are connected to a third mounting device in the form of a third mounting 4.3. This third mounting 4.3 in turn carries a third optical element in the form of a third lens 5.3. Accordingly, the third bipods 3.3 thus support the third lens 5.3 via the third mounting 4.3 on the first holder 2. In other words, the third lens 5.2 is thus fixed via the third mounting 4.3 and the third bipods 3.3 to the first holder 2.

The third bipods 3.3 are designed like the first bipods 3.1 and are fixed to the holder 2 and the third mounting 4.3 respectively, so that in this regard reference is made to the explanations given above. In particular, the third bipods 3.3 also form so-called parallel kinematics in the manner of a hexapod, by means of which the third mounting 4.3 and thus the third lens 5.3 can be actively positioned spatially with respect to the holder 2.

The first, the second and the third bipods 3.1, 3.2, 3.3 are arranged in the circumferential direction 2.2 uniformly distributed at inner circumference 2.1 of the holder 2. With a total number of S=9 bipods, the central axes of neighbouring bipods 3.1, 3.2 and 3.3 are arranged, with respect to the module axis 1.1 in the first circumferential direction 2.2, each rotated according to the following equation through an angle $$\alpha = \frac{360°}{S} = \frac{360°}{9} = 40° \qquad (1)$$

It goes without saying, however, that with other variants of the present invention it is also possible for the supporting devices not to be distributed uniformly in this way at the circumference of the holding device. Particularly in the case of numbers of supporting devices diverging from one another for the respective optical element, less uniform distributions of the supporting devices may be provided or necessary.

The legs 3.11 and 3.12 of the first bipods 3.1 each extend both in the direction of the module axis 1.1 and radially to the latter. By displacing one of the first bipods 3.1 once in a revolving manner at the inner circumference 2.1 of the holder 2 along the first circumferential direction 2.2, therefore, an annular circumferential first assembly space is defined, as is indicated in FIG. 1 by contour 3.18. The first assembly space has a shape in the manner of the shell of a truncated cone. In the present example with a circular holder, the first assembly space 3.18 is defined in other words by the toroidal body which arises when one of the first bipods 3.1 is rotated about the module axis 1.1.

The legs 3.21 and 3.22 of the second bipods 3.2 each extend both slightly in the direction of the module axis 1.1 and also mainly radially to the latter. By displacing one of the second bipods 3.2 once in a revolving manner at the inner circumference 2.1 of the holder 2 along the first circumferential direction 2.2, therefore, an annular circumferential second assembly space is also defined, as is indicated in FIG. 1 by the contour 3.28. The second assembly space 3.28 also has a shape in the manner of the shell of a very flat truncated cone. In the present example with a circular holder, the second assembly space 3.28 is also defined in other words by the toroidal body which arises when one of the second bipods 3.2 is rotated about the module axis 1.1.

The legs 3.31 and 3.32 of the third bipods 3.3 each extend both slightly in the direction of the module axis 1.1 and also mainly radially to the latter. By displacing one of the third bipods 3.2 once in a revolving manner at the inner circumference 2.1 of the holder 2 along the first circumferential direction 2.2, therefore, an annular circumferential third assembly space is also defined, as is indicated in FIG. 1 by contour 3.38. the third assembly space 3.38 also has a shape in the manner of the shell of a very flat truncated cone. In the present example with a circular holder, the third assembly space 3.38 is also defined in other words by the toroidal body which arises when one of the third bipods 3.3 is rotated about the module axis 1.1.

The first bipods 3.1 and the second bipods 3.2 are arranged interlocked or interlaced in such a way that the first assembly space 3.18 and the second assembly space 3.28 mutually intersect. The two assembly spaces 3.18 and 3.28 penetrate one another in a first penetration region 6.1. In the view of FIG. 2, the first penetration region 6.1 has an annular contour. the first penetration region 6.1 lies radially with respect to the module axis 1.1 roughly in the middle between the holder 2 and the mountings 4.1 and 4.2.

The first bipods 3.1 and the third bipods 3.3 are arranged interlocked or interlaced in such a way that the first assembly space 3.18 and the third assembly space 3.38 mutually intersect in the region of the connection elements 3.17 and 3.37 respectively. They intersect in a first intersection region 6.2. The latter also has an annular contour in the view of FIG. 2.

As a result of this design with the penetrating or intersecting assembly spaces 3.18 and 3.28 or 3.38 respectively, it is possible to keep the height dimension of the holder 2 short in the direction of the module axis 1.1, although a plurality of lenses 5.1 to 5.3 can be held by the holder 2. An assembly-space and weight reduction can be achieved as a result. The height dimension may, as the case may be, even be smaller than in the case where a single optical element is held by a comparable holding device, since the connection of a plurality of supporting devices may even contribute towards an increase in the rigidity of the optical module.

As a result of this compact arrangement, moreover, the bipods can also be kept as short as possible. This has an advantageous effect on the mass and rigidity of the supporting devices and thus on the resonant frequencies of the arrangement. In other words, in contrast with known optical modules, it is possible with the design of the optical module 1 according to the invention, with identical rigidity of the arrangement, to achieve a noticeable reduction in the required assembly space and thus in the mass of the optical module 1, as a result of which an advantageous increase in the resonant frequency of the overall arrangement is obtained.

The arrangement of the first and the third shoulders 2.3 and 2.5 in a common plane not only reduces the required assembly space. In fact, the production of the mounting is also thereby facilitated, since it can be produced for example from a single circumferential annular shoulder at the inner circumference 2.1.

The uniform distribution of the bipods 3.1, 3.2, 3.3 at the inner circumference 2.1 of the holder 2 described above ensures, together with their fixing at the shoulders 2.3, 2.4 and 2.5 respectively, which extend only to a limited extent in the circumferential direction 2.2, that the lenses 5.1, 5.2 and 5.3 can be assembled individually. Furthermore, it is possible to assemble or dismantle the lower first lens 5.1 and the upper third lens 5.3 independently of one another, without one of the other lenses having to be loosened or even removed. Only for the assembly of the middle, second lens 5.2 is it necessary, of course, to remove the first lens 5.1 and the third lens 5.3, respectively.

It goes without saying, however, that in other variants of the invention the separate assembly capability of the optical elements can also be ensured in any other way by a suitable design and arrangement of the connection regions between the supporting devices and the holding device.

Furthermore, it goes without saying that in other variants of the present invention the supporting devices can also be designed differently and be provided in a different number per optical element. In particular, it may be sufficient, with a suitable design, for only a single supporting device to be provided per optical element. Said supporting devices can then extend, as the case may be, over a correspondingly limited circumferential segment, in order to ensure the interlocked or interlaced arrangement with the intersection of the assembly spaces. Alternatively, such individual supporting devices can also extend over the whole circumference of the holding device. Here, suitable perforations for the other supporting device or other supporting devices must then be provided in order to ensure the interlocked or interlaced arrangement with the intersection of the assembly spaces.

Figure 3:
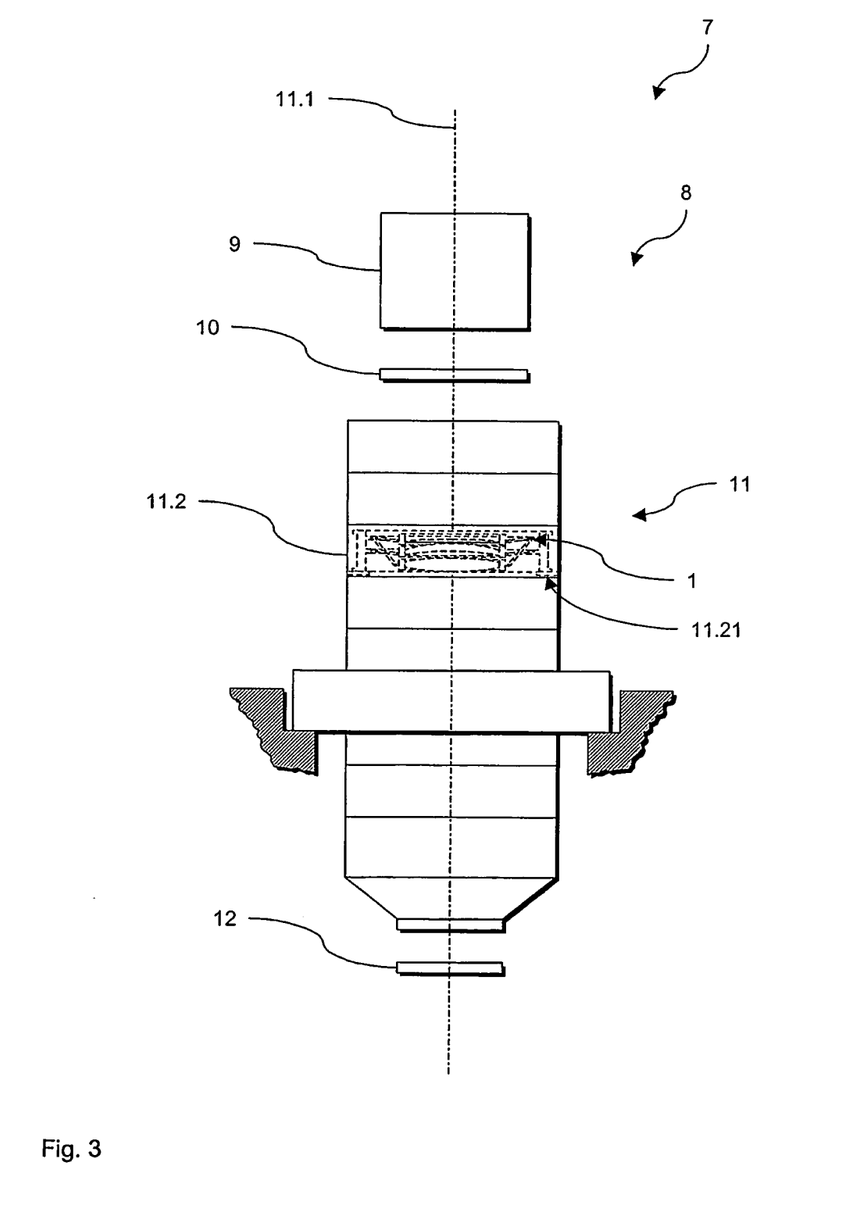
FIG. 3 is a schematic representation of a preferred embodiment of the microlithographic apparatus according to the invention with an objective barrel according to the invention.

FIG. 3 shows a diagrammatic representation of a preferred embodiment of microlithographic apparatus 7 according to invention. Microlithographic apparatus 7 includes an optical projection system 8 with a lighting system 9, a mask 10 and an objective barrel 11 with an optical objective axis 11.1. The lighting system 9 illuminates a mask 10. On the mask 10 is a pattern which is projected via the objective barrel 11 onto a substrate 12, for example a wafer.

The objective barrel 11 includes a series of barrel modules 11.2 with refractive, reflective and/or diffractive optical elements such as lenses, mirrors, gratings or the like. The barrel module 11.2 includes the optical module 1 from FIGS. 1 and 2. the optical module 1 is fixed to a carrier structure 11.21 of the barrel module 11.2.

Second Embodiment

Figure 4:
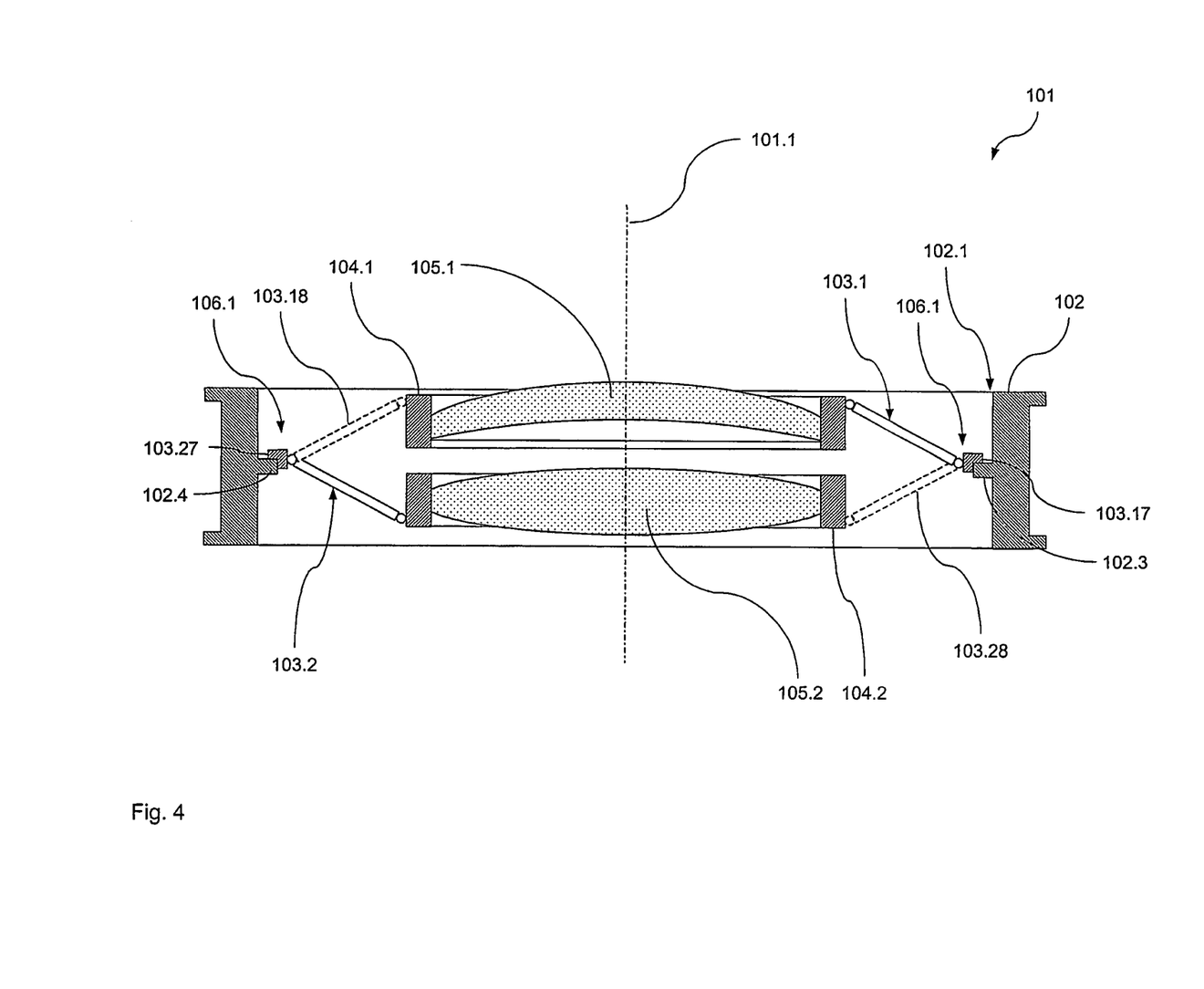
FIG. 4 is a schematic sectional representation of a further preferred embodiment of the optical module according to the invention.
Figure 5:
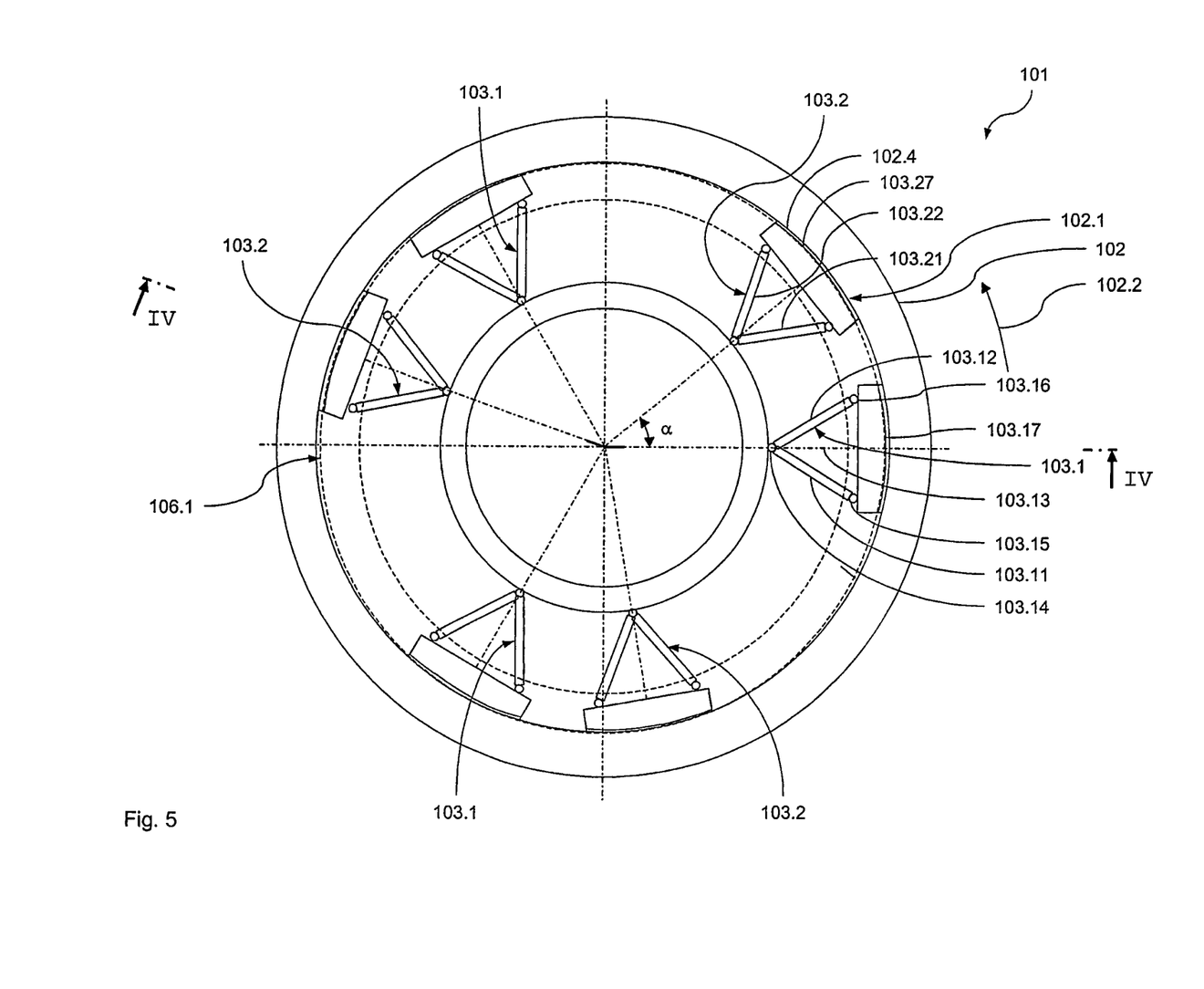
FIG. 5 is a schematic plan view of the optical module from FIG. 4.

FIGS. 4 and 5 show a schematic representation of a further, second preferred embodiment of the optical module 101 according to the invention for an objective for microlithography. FIG. 4 shows a cross-section along the section line IV-IV from FIG. 5. This embodiment does not differ in its basic mode of operation and its basic structure from that shown in FIGS. 1 and 2, so that the differences will mainly be dealt with here.

the optical module 101 includes a first holding device in the form of an annular holder 102. This holder 102 has an inner circumference 102.1, which extends in a first circumferential direction 102.2. Three first supporting devices in the form of first bipods 103.1 (shown in very simplified form) are fixed with one end to the inner circumference 102.2 of the holder 102. the first bipods 103.1 are connected with their other end to a first mounting device in the form of a first mounting 104.1. This first mounting 104.1 in turn carries a first optical element in the form of a lens 105.1.

The first bipods 103.1 each have a first leg 103.11 and a second leg 103.12. The latter are arranged inclined towards one another in their common plane, so that the respective bipod 103.1 has a central axis 103.13. The first bipods 103.1 are distributed uniformly at the first circumference 102.1 of the holder 102, so that an angle of 120° is enclosed in each case between their first central axes 103.13 in the first plane, which is parallel to the drawing plane of FIG. 5 and in which circumferential direction 102.2 lies.

The first bipods 103.1 are designed like the first bipods 103.1 from FIGS. 1 and 2 and are fixed to the holder 102 and the first mounting 104.1 respectively. In particular, the first bipods 103.1 are again fixed by means of first connection elements 103.17 detachably on a first contact element in the form of a first shoulder 102.3 at the inner circumference 102.1 of the holder 102. The first shoulders 102.3 are all located in a first connecting plane which runs perpendicular to the module axis 1.1.

Like the first bipods 103.1 from FIGS. 1 and 2, the first bipods 103.1 form together parallel kinematics in the manner of a hexapod, by means of which the first mounting 104.1 and thus the first lens 105.1 can be actively positioned spatially with respect to the holder 102 and is mounted isostatically.

As can be seen for FIGS. 4 and 5, furthermore, the optical module 101 also includes three second supporting devices in the form of the second bipods 103.2 (also shown in very simplified form). The latter, like the first bipods 103.1, are each fixed with one end to the inner circumference 102.1 of the holder 103 by means of a second connection element 103.27. The second connection element 103.27 is again fixed detachably on a second shoulder 102.4 at the inner circumference 102.1 of the holder 102. The second shoulders 102.4 are all also located in the first connecting plane.

With their other end, the second bipods 103.2 are connected to a second mounting device in the form of a second mounting 104.2. This second mounting 104.2 in turn carries a second optical element in the form of a second lens 105.2. The second bipods 103.2 are designed like the first bipods 103.1 and are fixed to the holder 102 and the second mounting 104.2 respectively, so that in this regard reference is made to the explanations given above. In particular, the second bipods 103.2 also form so-called parallel kinematics in the manner of a hexapod, by means of which the second mounting 104.2 and thus the second lens 105.2 can be actively positioned spatially with respect to the holder 102.

The second bipods 103.2, furthermore, are also distributed uniformly at the first circumference 102.1 of the holder 102, so that an angle of 120° is enclosed in each case between their second central axes 103.23 in the first plane, which is parallel to the drawing plane of FIG. 5 and in which the circumferential direction 2.2 lies.

The first and second bipods 103.1, 103.2, furthermore, are arranged distributed in the circumferential direction 102.2 at the inner circumference 102.1 of the holder 102, in such a way that the central axes of neighbouring bipods 103.1, 103.2 are each arranged rotated through an angle α=40° with respect to the module axis 101.1 in the first circumferential direction 102.2.

The legs 103.11 and 103.12 of the first bipods 103.1 each extend both in the direction of the module axis 101.1 and radially to the latter. By displacing one of the first bipods 103.1 once in a revolving manner at the inner circumference 102.1 of the holder 102 along the first circumferential direction 102.2, therefore, an annular circumferential first assembly space is defined, as is indicated in FIG. 4 by the contour 103.18. The first assembly space has a shape in the manner of the shell of a truncated cone. In the present example with a circular holder, the first assembly space 103.18 is defined in other words by the toroidal body which arises when one of the first bipods 103.1 is rotated about the module axis 101.1.

The legs 103.21 and 103.22 of the second bipods 103.2 each extend both slightly in the direction of the module axis 101.1 and radially to the latter. By displacing one of the second bipods 103.2 once in a revolving manner at the inner circumference 102.1 of the holder 102 along first circumferential direction 102.2, therefore, an annular circumferential second assembly space is also defined, as is indicated in FIG. 4 by the contour 103.28. The second assembly space 103.28 also has a shape in the manner of the shell of a truncated cone. In the present example with a circular holder, the second assembly space 103.28 is also defined in other words by the toroidal body which arises when one of the second bipods 103.2 is rotated about the module axis 101.1.

Apart from the number of lenses carried by the optical module 101, the essential difference from the embodiment shown in FIGS. 1 and 2 consists in fact that the first bipods 103.1 and the second bipods 103.2 are orientated in such a way that the first lens 105.1 is held above the first connecting plane, whilst the second lens 105.2 is held below the first connecting plane.

The first bipods 103.1 and the second bipods 103.2 are also arranged interlocked or interlaced in such a way that the first assembly space 103.18 and the second assembly space 103.28 mutually intersect. The first intersection region 106.1 has an annular contour in the view of FIG. 5.

As a result of this design with intersecting assembly spaces 103.18 and 103.28, it is possible to keep the height dimension of the holder 102 short in the direction of the module axis 101.1, although a plurality of lenses 105.1 to 105.3 are held by the holder 102. An assembly-space and weight reduction as well as an increase in the resonant frequency of the overall arrangement can be achieved by this means, as already described in detail above. By the arrangement of the lenses 105.1 and 105.2 respectively above and below the first connecting plane, it is possible in particular to achieve a very compact arrangement with very short bipods 103.1 and 103.2.

The arrangement of the first and third shoulders 102.3 and 102.4 in a common plane again not only reduces the required assembly space. In fact, the production of the mounting 102 is also thereby facilitated, since it can be produced for example from a single circumferential annular shoulder at the inner circumference 102.1.

the optical module 101 can be used instead of any optical module, e.g. instead of the optical module 1, in the microlithographic apparatus from FIG. 3.

Third Embodiment

Figure 6:
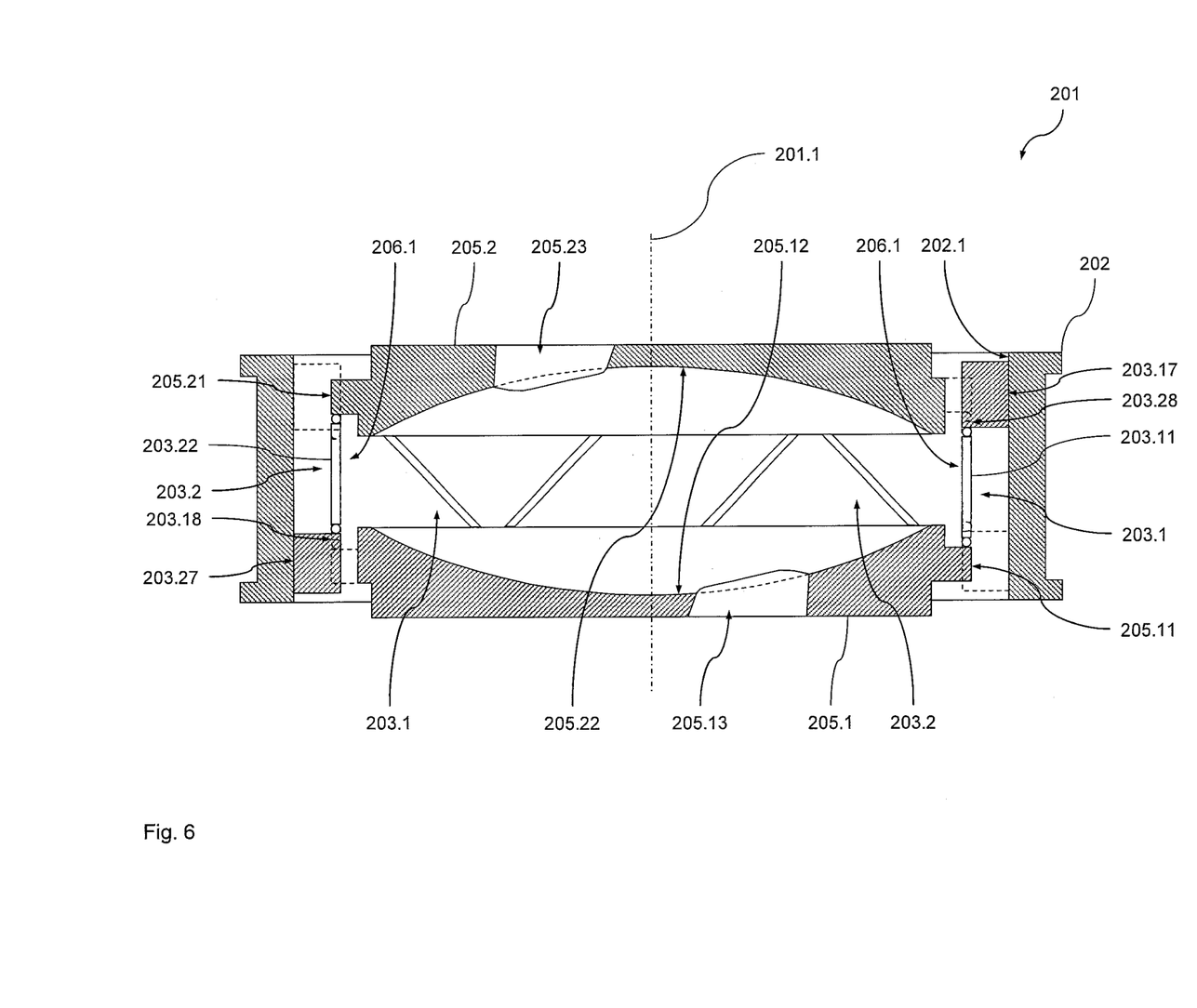
FIG. 6 is a schematic sectional representation of a further preferred embodiment of the optical module according to the invention.
Figure 7:
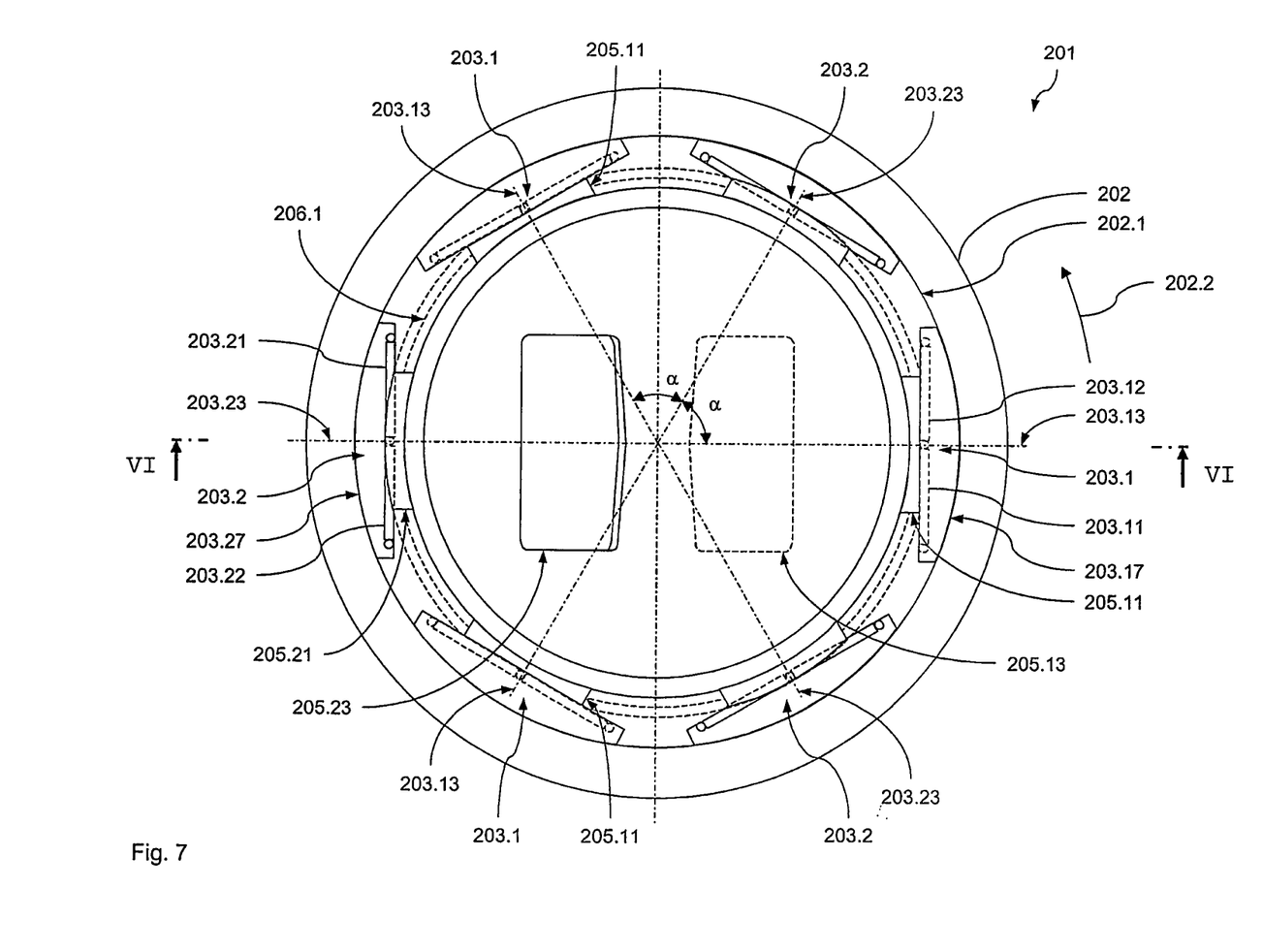
FIG. 7 is a schematic plan view of the optical module from FIG. 6.

FIGS. 6 and 7 show schematic representations of a third preferred embodiment of the optical module 201 according to the invention for an objective for microlithography. FIG. 6 is a cross-section along the section line VI-VI from FIG. 7. This embodiment does not differ in its basic mode of operation and its basic structure from that shown in FIGS. 1 and 2, so that the differences will mainly be dealt with here.

The optical module 201 includes a first holding device in the form of an annular holder 202. This holder 202 has an inner circumference 202.1, which extends in a first circumferential direction 202.2. Three first supporting devices in the form of active first bipods 203.1 (shown in very simplified form) are fixed with one end to the inner circumference 202.1 of the holder 202. The first bipods 203.1 are connected with their other end directly to a first optical element in the form of a mirror 205.1.

The first bipods 203.1 each have a first leg 203.11 and a second leg 203.12. The latter are arranged inclined towards one another in their common plane, so that the respective bipod 203.1 has a first central axis 203.13. The first bipods 203.1 are distributed uniformly at the first circumference 202.1 of the holder 202, so that an angle of 120° is enclosed in each case between their first central planes 203.13, which run perpendicular to the drawing plane of FIG. 7, in the first plane parallel to the drawing plane of FIG. 7 in which the circumferential direction 202.2 lies.

The respective first bipod 203.1 is, as mentioned, connected directly to the first mirror 205.1, i.e. without an interposed mounting or the like. For this purpose, the first mirror 205.1 has three radial projections 205.11, to which the legs 203.11 and 203.12 of the respective first bipod 203.1 are fixed.

The first bipods 203.1 are in principle designed like the first bipods 203.1 from FIGS. 1 and 2 and are fixed to the holder 202 and the first mirror 205.1, respectively. In particular, the first bipods 203.1 are again fixed detachably at the inner circumference 202.1 of the holder 202 by means of first connection elements 203.17. The first connection elements 203.17 are all located in a first connecting plane which runs perpendicular to the module axis 201.1. The first connection elements 203.7 can be connected to the holder 202 for example by means of screw joints, clamping joints or the like acting in the radial direction of the holder 202.

Like the first bipods 3.1 shown in FIGS. 1 and 2, the first bipods 203.1 form together so-called parallel kinematics in the manner of a hexapod, by means of which the first mirror 205.1 can be actively positioned spatially with respect to the holder 202 and is mounted isostatically.

As can also be seen from FIGS. 6 and 7, the optical module 201 also includes three second supporting devices in the form of active second bipods 203.2 (also shown in very simplified form). The latter, like the first bipods 203.1, are each fixed with one end at the inner circumference 202.1 of the holder 203 by means of a second connection element 203.27. The second connection elements 203.27 can be connected detachably to the holder 202, once again for example by means of screw joints, clamping joints are suchlike acting in the radial direction of the holder 202. The second connection elements 203.27 are all located in a second connecting plane.

With their other end, the second bipods 203.2 are connected directly, i.e. without an interposed mounting or the like, to a second optical element in the form of a second mirror 205.2. For this purpose, the second mirror 205.2 also has three radial projections 205.21, to which the legs 203.21 and 203.22 of the respective second bipod 203.2 are fixed.

The second bipods 203.2 are designed like the first bipods 203.1 and are fixed to the holder 202 and the second mirror 205.2 respectively, so that in this regard reference is made to the explanations given above. In particular, the second bipods 203.2 also form so-called parallel kinematics in the manner of a hexapod, by means of which the second mirror 205.2 can be actively positioned spatially with respect to the holder 202.

Furthermore, the second bipods 203.2 are also uniformly distributed at the first circumference 202.1 of the holder 202, so that an angle of 120° is enclosed in each case between their second central planes 203.23, which run perpendicular to the drawing plane of FIG. 7, in the first plane parallel to the drawing plane of FIG. 7, in which the circumferential direction 202.2 lies.

Furthermore, the first and second bipods 203.1, 203.2 are arranged, in the circumferential direction 202.2, uniformly distributed at inner circumference 202.1 of the holder 202, so that the central planes of neighbouring bipods 203.1, 203.2 are arranged, with respect to the module axis 201.1 in the first circumferential direction 202.2, each rotated according to the above equation (1) through an angle $\alpha=60°$.

The legs 203.11 and 203.12 of the first bipods 203.1 each extend both in the direction of the module axis 201.1 and tangentially to the first circumferential direction 202.2. By displacing one of the first bipods 203.1 once in a revolving manner at the inner circumference 202.1 of the holder 202 along the first circumferential direction 202.2, therefore, an annular circumferential first assembly space is defined, as is indicated in FIG. 6 by the contour 203.18. The first assembly space has a shape in the manner of the shell of a cylinder. In the present example with an annular holder, the first assembly space 203.18 is defined in other words by the toroidal body which arises when one of the first bipods 203.1 is rotated about the module axis 201.1.

The legs 203.21 and 203.22 of the second bipods 203.2 each extend both slightly in the direction of the module axis 201.1 and tangentially to the first circumferential direction 202.2. By displacing one of the second bipods 203.2 once in a revolving manner at the inner circumference 202.1 of the holder 202 along the first circumferential direction 202.2, therefore, an annular circumferential second assembly space is also defined, as is indicated in FIG. 6 by contour 203.28. The second assembly space 203.28 also has a shape in the manner of the shell of a cylinder. In the present example with a circular holder, the second assembly space 203.28 is also defined in other words by the toroidal body which arises when one of the second bipods 203.2 is rotated about the module axis 201.1.

Apart from the number of mirrors carried by the optical module 201, an essential difference from the embodiment shown in FIGS. 1 and 2 consists in fact that the first bipods 203.1 and the second bipods 203.2 are orientated in such a way that the first mirror 205.1 is held below the first connecting plane, whilst the second mirror 205.2 is held above the second connecting plane, which in turn lies below the first connecting plane.

A further difference consists in the fact that the first bipods 203.1 and the second bipods 203.2 are orientated in such a way that a cylinder shell-shaped first assembly space 203.18 and a cylinder jacket-shaped second assembly space 203.28 coaxial thereto and of essentially the same diameter are defined. The first bipods 203.1 and the second bipods 203.2 are arranged interlocked or interlaced in such a way that the first assembly space 203.18 and the second assembly space 203.28 mutually intersect or penetrate. The first intersection region 206.1 also has a cylinder shell-shaped contour. The first assembly space 203.18 and the second assembly space 203.28 in other words penetrate one another in such a way that they essentially overlap one another over a wide section. This produces a particularly space-saving supporting structure, which also enables the assembly of optical elements of large diameter into an objective barrel of predetermined internal diameter.

As a result of this design with the penetrating assembly spaces 203.18 and 203.28, it is possible to keep the height dimension of holder 202 short in the direction of the module axis 201.1, although a plurality of the mirrors 205.1 to 205.3 are held by the holder 202. An assembly-space and weight reduction as well as an increase in the resonant frequency of the overall arrangement can be achieved by this means, as already described in detail above. By the arrangement of the mirrors 205.1 and 205.2 respectively above and below the assigned connecting plane, it is possible in particular to achieve a very compact arrangement with very short bipods 203.1 and 203.2.

The first mirror 205.1 has a reflecting first face 205.12 and a first through hole 205.13. The same applies to the second mirror 205.1, which has a reflecting second face 205.22 and a second through hole 205.23. The mirrors 205.1 and 205.2 are held in such a way that their reflecting faces 205.12 and 205.22 are facing towards one another. The through holes 205.13 and 205.23 ensure that the useful light can first pass through the first perforation 205.13 into the space between the reflecting faces 205.12 and 205.22, is deflected by the reflecting first face 205.12 onto the second reflecting face 205.22 and from the latter can leave the space between the reflecting faces 205.12 and 205.22 through the second through hole 205.23. In this way, it is possible to achieve a very compact catadioptric arrangement in an extremely narrow space. In the same way as in the second embodiment, the optical module 201 can be used instead of any optical module, in particular in place of the optical module 1, in the microlithographic apparatus from FIG. 3.

The present invention has been described above solely with the aid of examples, wherein optical elements of the same kind are held in a single optical module. It goes without saying, however, that the present invention can also be used for any combinations of optical elements of different kinds which are held in a single optical module.

The present invention has also been described above solely with the aid of examples from the area of objectives for microlithography. It goes without saying, however, that the present invention can also be used for any other objectives.

The invention claimed is:

1. An optical module comprising:
a first holding device with an inner circumference, which extends in a first circumferential direction,
at least one first supporting device configured to support a first optical element, said at least one first supporting device being fixed at said inner circumference of said first holding device, a first assembly space being defined by a first shell formed if said at least one first supporting device were displaced through 360° about a central axis and along said first circumferential direction; and
at least one second supporting device configured to support a second optical element, said at least one second supporting device being fixed at said inner circumference of said first holding device, a second assembly space being defined by a second shell formed if said at least one second supporting device were displaced through 360° along said first circumferential direction, and
wherein:
- said first shell has an outer surface having a first end located at said inner circumference of said first holding device at a first level along said central axis and a second end located adjacent said first optical element at a second level along said central axis, said second end of said first shell being opposite said first end of said first shell and said second level being spaced from said first level along said central axis;
- said second shell has an outer surface having a first end located at said inner circumference of said first holding device and a second end adjacent said second optical element, said second end of said second shell being opposite said first end of said second shell;
- said outer surface of said first shell intersects said outer surface of said second shell so that said first assembly space intersects said second assembly space,
- said at least one first supporting device does not contact said at least one second supporting device,
- said first optical element is separate from said second optical element;
- said first optical element is non-contiguous with said second optical element; and
- said optical module is configured to be used in a microlithography objective.

2. The optical module according to claim 1, wherein said first assembly space penetrates said second assembly space.

3. The optical module according to claim 1, wherein said first circumferential direction lies in a first plane and at least one of:
- at least one of said at least one first supporting device and said at least one second supporting device extends at least in a first direction which runs perpendicular to said first circumferential direction in said first plane, and
- at least one of said at least one first supporting device and said at least one second supporting device extends at least in a second direction which runs perpendicular to said first plane.

4. The optical module according to claim 1, wherein:
- at least one third supporting device is provided for supporting a third optical element, said at least one third supporting device being fixed at said inner circumference of said first holding device,
- a third assembly space is defined by a third shell formed if said at least one third supporting device were displaced through 360° along said first circumferential direction, and
- said third assembly space intersects at least one of said first assembly space and said second assembly space.

5. The optical module according to claim 1, wherein a supporting device is displaced with respect to a neighboring supporting device in said first circumferential direction.

6. The optical module according to claim 1, wherein:
- said optical module has a total number S of said first and second supporting devices fixed at the inner circumference of said first holding device;
- said total number S of said first and second supporting devices includes said at least one first supporting device and said at least one second supporting device;
- one of said total number S of said first and second supporting devices is displaced with respect to a neighboring one of said total number S of said first and second supporting devices by an angle $$\alpha = \frac{360°}{S}$$

with respect to a central axis of said first holding device in said first circumferential direction;
- said central axis runs perpendicular to a first plane in which said first circumferential direction lies.

7. The optical module according to claim 1, wherein at least one supporting device is fixed detachably to said first holding device, said at least one supporting device being selected from the group consisting of said at least one first supporting device, said at least one second supporting device, and a combination thereof.

8. The optical module according to claim 7, wherein said at least one supporting device includes at least one connection element for the connection of said at least one supporting device to said first holding device.

9. The optical module according to claim 1, wherein:
- said at least one first supporting device is connected to a first contact element of said first holding device,
- said at least one second supporting device is connected to a second contact element of said first holding device,
- said first contact element and said second contact element being arranged substantially in a common second plane, which runs parallel to a first plane in which said first circumferential direction lies.

10. The optical module according to claim 1, wherein at least one supporting device is fixed to said first holding device so as to be adjustable, said at least one supporting device being selected from the group consisting of said at least one first supporting device, said at least one second supporting device, and a combination thereof.

11. The optical module according to claim 1, wherein at least one supporting device is designed for the adjustment, of the position of said optical element supported by said at least one supporting device, said at least one supporting device being selected from the group consisting of said at least one first supporting device, said at least one second supporting device, and a combination thereof.

12. The optical module according to claim 1, wherein, for at least one optical element, a number of said first and second supporting devices are fixed to said first holding device and are designed for a statically determined support, of said at least one optical element.

13. The optical module according to claim 1, wherein at least one supporting device is designed in the manner of a bipod, said at least one supporting device being selected from the group consisting of said at least one first supporting device, said at least one second supporting device, and a combination thereof.

14. The optical module according to claim 1, wherein:
- for at least one optical element selected from the group consisting of said first optical element and said second optical element, a mounting device is provided which is connected detachably to the end of at least one supporting device for the at least one optical element facing away from said first holding device;
- said at least one supporting device is selected from the group consisting of said at least one first supporting device, said at least one second supporting device, and a combination thereof.

15. The optical module according to claim 1, wherein:
- at least one optical element is supported by at least one supporting device on said holding device;

said at least one supporting device is selected from the group consisting of said at least one first supporting device, said at least one second supporting device, and a combination thereof; and
said at least one optical element is selected from the group consisting of said first optical element and said second optical element.

16. The optical module according to claim 15, wherein said at least one optical element is connected directly to the end of said at least one supporting device for said at least one optical element facing away from said first holding device.

17. The optical module according to claim 15, wherein said at least one optical element is a reflecting element.

18. The optical module according to claim 15, wherein said at least one optical element has a projection, which is connected to the end of said at least one supporting device for said at least one optical element facing away from said first holding device.

19. The optical module according to claim 1, wherein:
a reflecting first optical element is supported by said at least one first supporting device; and
a reflecting second optical element is supported by said at least one second supporting device.

20. The optical module according to claim 19, wherein:
said first optical element has a reflecting first face and said second optical element has a reflecting second face,
said first optical element and said second optical element are arranged directly adjacent to one another; and
said reflecting first face is facing said reflecting second face.

21. The optical module according to claim 1, wherein the at least one first supporting device is a first bipod.

22. The optical module according to claim 21, wherein the at least one second supporting device is a second bipod.

23. The optical module according to claim 1, wherein the first shell is in the shape of a truncated cone, and the second shell is in the shape of a truncated cone.

24. The optical module according to claim 1, wherein the first shell is in the shape of a cylinder, and the second shell is in the shape of a cylinder.

25. The optical module according to claim 1, wherein the first shell is in the shape of a toroidal body, and the second shell is in the shape of a toroidal body.

26. An optical module comprising:
a first holding device with an inner circumference, which extends in a first circumferential direction,
at least one first supporting device configured to support a first optical element, said at least one first supporting device being fixed at said inner circumference of said first holding device, a first assembly space being defined by a first shell formed if said at least one first supporting device were displaced through 360° about a central axis and along said first circumferential direction; and
at least one second supporting device configured to support a second optical element, said at least one second supporting device being fixed at said inner circumference of said first holding device, a second assembly space being defined by a second shell formed if said at least one second supporting device were displaced through 360° along said first circumferential direction, and
wherein:
said first shell has an outer surface having a first end located at said inner circumference of said first holding device at a first level along said central axis and a second end located adjacent said first optical element, said second end of said first shell being opposite said first end of said first shell;
said second shell has an outer surface having a first end located at said inner circumference of said first holding device at a second level along said central axis and a second end located adjacent said second optical element, said second end of said second shell being opposite said first end of said second shell;
said outer surface of said first shell intersects said outer surface of said second shell so that said first assembly space intersects said second assembly space,
said at least one first supporting device does not contact said at least one second supporting device,
said first optical element is separate and spaced from said second optical element in a spacing direction along said central axis;
said first level being spaced from said second level in a direction opposite to said spacing direction;
said first optical element is non-contiguous with said second optical element; and
said optical module is configured to be used in a microlithography objective.

27. An optical module comprising:
a first holding device with an inner circumference, which extends in a first circumferential direction,
at least one first supporting device configured to support a first optical element, said at least one first supporting device being fixed at said inner circumference of said first holding device, a first assembly space being defined by a first shell formed if said at least one first supporting device were displaced through 360° along said first circumferential direction; and
at least one second supporting device configured to support a second optical element, said at least one second supporting device being fixed at said inner circumference of said first holding device, a second assembly space being defined by a second shell formed if said at least one second supporting device were displaced through 360° along said first circumferential direction, and
wherein:
said first shell has an outer surface having a first end located at said inner circumference of said first holding device and a second end located adjacent said first optical element, said second end of said first shell being opposite said first end of said first shell;
said second shell has an outer surface having a first end located at said inner circumference of said first holding device and a second end located adjacent said second optical element, said second end of said second shell being opposite said first end of said second shell;
said outer surface of said first shell intersects said outer surface of said second shell so that said first assembly space intersects said second assembly space,
said at least one first supporting device does not contact said at least one second supporting device,
said first optical element is separate from said second optical element;
said first optical element is non-contiguous with said second optical element;
said first optical element has an optical surface reflecting light directly onto an optical surface of said second optical element; and
said optical module is configured to be used in a microlithography objective.

* * * * *

UNITED STATES PATENT AND TRADEMARK OFFICE
CERTIFICATE OF CORRECTION

PATENT NO. : 8,711,331 B2
APPLICATION NO. : 11/597297
DATED : April 29, 2014
INVENTOR(S) : Jens Kugler, Franz Sorg and Yim-Bun Patrick Kwan Page 1 of 1

It is certified that error appears in the above-identified patent and that said Letters Patent is hereby corrected as shown below:

On the Title Page, Item (56), Col. 2 (Other Publications), line 1, delete "Patentibility" and insert -- Patentability --.

In the Specification

In Col. 3, line 31, delete "invention" and insert -- invention; --.

In Col. 4, line 9, delete "3.13. the" and insert -- 3.13. The --.

In Col. 4, line 63, delete "and/or and" and insert -- and/or --.

In Col. 6, line 44, delete "3.38. the" and insert -- 3.38. The --.

In Col. 8, line 5, delete "2. the" and insert -- 2. The --.

In Col. 8, line 22, delete "102. the" and insert -- 102. The --.

Signed and Sealed this
Fifteenth Day of July, 2014

Michelle K. Lee
*Deputy Director of the United States Patent and Trademark Office*